United States Patent [19]

Hach et al.

[11] Patent Number: 5,111,123

[45] Date of Patent: May 5, 1992

[54] MOTOR DRIVER INTERFACE FAULT DETECTION APPARATUS USING INITIAL TURN-ON AND NOISE TIMERS

[75] Inventors: Larry R. Hach; Gerard F. Kelley, both of Kokomo, Ind.

[73] Assignee: Delco Electronics Corporation, Kokomo, Ind.

[21] Appl. No.: 615,694

[22] Filed: Nov. 16, 1990

[51] Int. Cl.⁵ .............................................. H02H 7/08
[52] U.S. Cl. ...................................... 318/434; 361/28
[58] Field of Search ...................... 361/28, 23, 83, 89, 361/33, 30; 318/434; 388/903, 921; 324/537, 545, 158 MG

[56] References Cited

U.S. PATENT DOCUMENTS

| | | | |
|---|---|---|---|
| 3,555,354 | 3/1969 | Kotos | 361/28 X |
| 4,590,533 | 5/1986 | Murata | 361/86 |
| 4,704,653 | 11/1987 | Li | 361/86 X |
| 4,725,765 | 2/1988 | Miller | 318/434 |
| 4,901,366 | 2/1990 | Rottger | 388/811 |
| 4,924,158 | 5/1990 | Kelley et al. | 318/434 |
| 5,003,426 | 3/1991 | Yeh et al. | 361/96 X |
| 5,019,779 | 5/1991 | Ookawa | 361/253 X |

*Primary Examiner*—William M. Shoop, Jr.
*Assistant Examiner*—A. Jonathan Wysocki
*Attorney, Agent, or Firm*—Robert M. Sigler

[57] ABSTRACT

A motor driver interface (MDI) circuit includes fault detection apparatus effective to detect short circuits to the power supply in the switching transistors of an H-bridge reversible DC motor arrangement. A pair of timers distinguishes a true fault condition. The first timer is responsive to a continuous fault detection to define a first time period from its initiation; and a second timer is responsive to a continuous presence of a transistor conduction signal to define a second time period from its initiation. The apparatus stores a fault signal in response to the detection of the fault condition at the end of the first or second time periods with the first timer providing fault detection upon turn-on after the brief initial high transistor turn-on current and the second timer providing noise immunity.

7 Claims, 3 Drawing Sheets

5,111,123

MOTOR DRIVER INTERFACE FAULT DETECTION APPARATUS USING INITIAL TURN-ON AND NOISE TIMERS

BACKGROUND OF THE INVENTION

This invention relates to fault detection apparatus for a motor driver interface circuit. Such an interface circuit is disclosed which connects motor power drive apparatus to a computer control and allows motor operation in a plurality of selectable modes. One of these modes is the control of a reversible DC motor with switching transistors in an H-bridge configuration. It is desired to include fault detection circuitry which monitors the switching transistors for short circuits to supply or ground voltage which might damage them. However, such monitoring should not produce a false fault signal due to noise or to the brief initial high current of a switching transistor when it is first turned on.

SUMMARY OF THE INVENTION

The apparatus of the invention uses a pair of timers to distinguish a true fault condition and prevent a false fault signal. The apparatus monitors the voltage at a motor terminal of the H-bridge to detect an indicated short circuit to the power supply. A first timer is responsive to a continuous detection of the fault condition to define a first time period from its initiation; and a second timer is responsive to a continuous presence of a transistor conduction signal to define a second time period from its initiation. The apparatus stores a fault signal in response to the detection of the fault condition at the end of the first or second time periods. The first time period is just longer than the time required for the one of the switching transistors to establish a conducting state, so that a fault signal will be stored as soon as possible after initial transistor turn-on but no false fault signal will result from the brief high initial transistor currents. The second time period is longer than the first but shorter than the time required for the one of the switching transistors to be damaged by a short circuit across the power supply so as to prevent false fault signals due to noise.

DESCRIPTION OF A PREFERRED EMBODIMENTS

Overall Description of Motor Driver Interface

Figure 1:
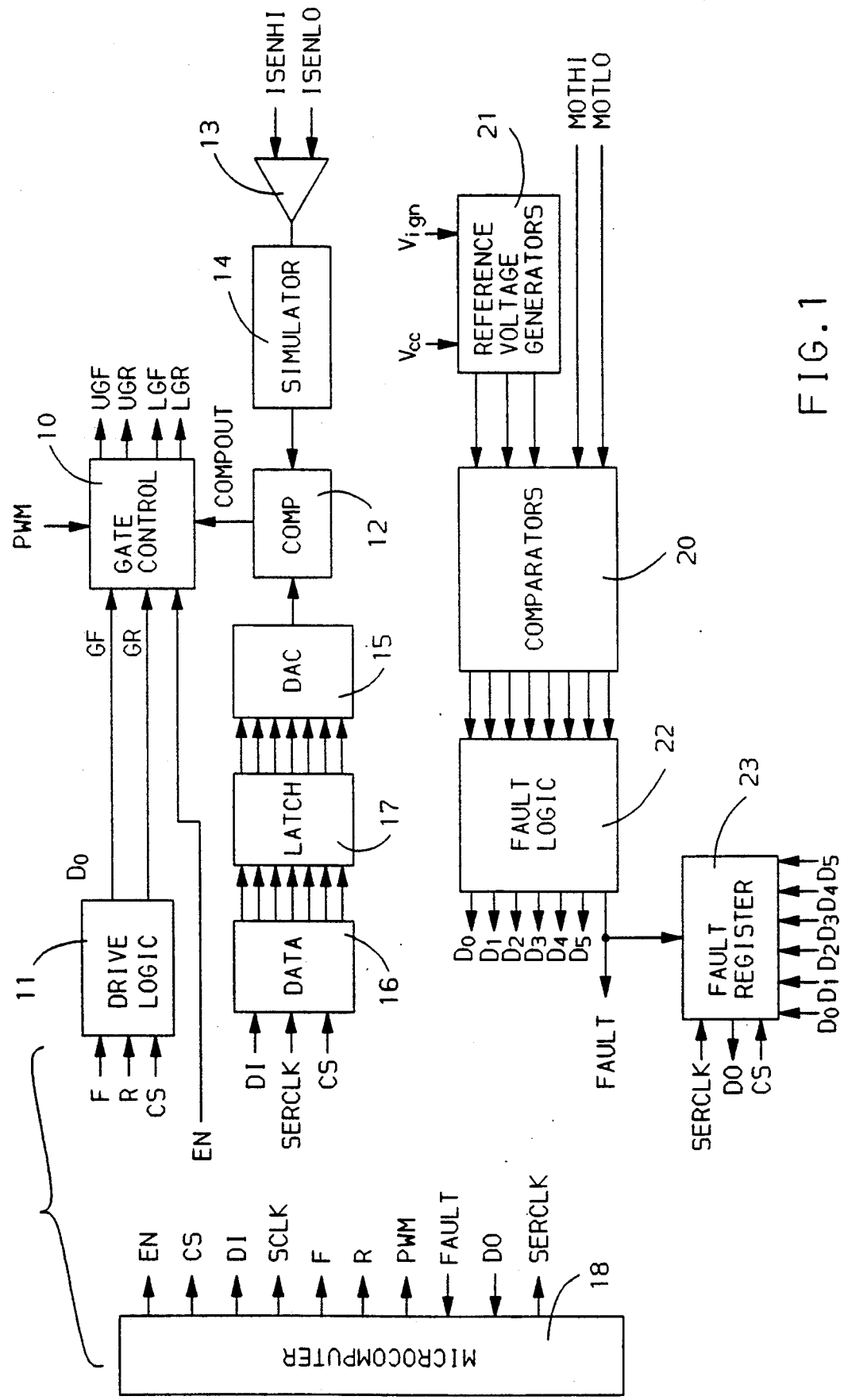
FIG. 1 is a block diagram of a motor driver interface with fault detection appparatus according to the invention.

Referring to FIG. 1, a Motor Driver Interface (MDI) comprises a gate control 10 with four driver outputs —UGF, UGR, LGF, LGR —each adapted to provide a gate on/off signal voltage to the gate of a power FET. These four signals comprise the control output of the motor driver interface. Gate control 10 receives an external signal PWM, which may take one of three forms: (1) a rectangular PWM (pulse width modulated) voltage wave 0/5 volts at a variable duty cycle, (2) a constant $V_{cc}$ (5 volts DC), or (3) $V_{ign}$, a vehicle ignition voltage of 9-16 volts DC. This signal indicates the desired mode of operation (PWM, bang/bang, or solenoid, respectively) and, in the case of PWM mode, also provides the duty cycle.

Figure 2:
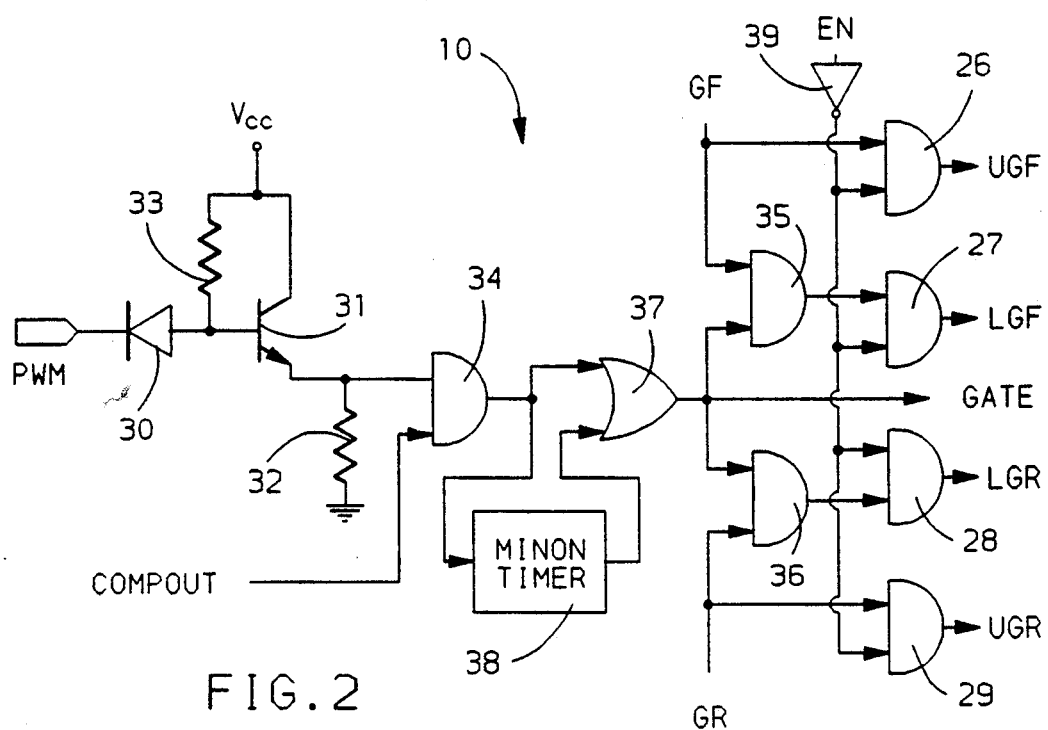
FIG. 2 is a circuit and logic diagram of a gate control for use in the motor driver interface of FIG. 1.

Gate Control 10 is shown in more detail in FIG. 2. The PWM input signal is provided through a reverse diode 30 to the base of an NPN transistor 31 having a collector tied to chip supply voltage $V_{cc}$ (5 volts) and an emitter connected through a load resistor 32 to ground, the base of transistor 31 being connected through a bias resistor 33 to $V_{cc}$. The emitter of transistor 31 is connected to one input of an AND gate 34, the other input of which receives a signal COMPOUT, to be described. The output of AND gate 34 is provided to one input of an OR gate 37 and to the input of a MIN ON timer 38, the output of which is provided to the other input of OR gate 37. MIN ON timer 38 is initiated by a positive transition in the output of AND gate 34 to provide a high output of a predetermined minimum duration such as 16 microseconds. This ensures that, when the GATE output of OR gate 37 goes high to turn on a FET, it stays on for at least the minimum time, even if the output of AND gate 34 goes low again before 16 microseconds has elapsed. The reason for this will be described at a later point in this description.

The output (GATE) of OR gate 37 is provided to one input each of AND gates 35 and 36. AND gate 35 receives on its other input a processed forward signal GF; while AND gate 36 receives on its other input a processed reverse signal GR. The outputs of AND gates 35 and 36 are provided to inputs of AND gates 27 and 28, respectively; whereas signals GF and GR are provided to inputs of AND gates 26 and 29, respectively. Signal EN is inverted in inverter 39, the output of which is provided to the other inputs of AND gates 26-29. The outputs of AND gates 26-29, suitably amplified, are the signals UGF, LGF, LGR and UGR, respectively.

Referring again to FIG. 1, a drive logic block 11 receives signals F and R, for choosing forward or reverse motor operation, and a chip select signal CS, for choosing this particular MDI circuit in a multi-motor system. Drive logic block 11 generates the processed forward and reverse signals GF and GR from signals F and R, respectively, and provides signals GF and GR to gate control 10, the processing ensuring that no action is taken if both F and R are high or if they have not both been constant for a predetermined time. Drive logic block 11 corresponds to drive logic block 32 and delay block 34 in a U.S. Pat. No. 4,924,158, issued May 8, 1990 and entitled Motor Driver Protection Circuit.

Signal COMPOUT is provided by a comparator 12, which compares a current feedback signal with a predetermined current reference. The current feedback signal is obtained from inputs ISENHI and ISENLO, which are connected to the ends of a current sensing resistor in series with the motor or solenoid to be controlled. The difference between these input signal voltages is amplified in a difference amplifier 13 and provide to a load current simulator circuit 14, the output of which is provided to one input of comparator 12. Simulator circuit 14 provides a signal which not only reflects the load current flowing through the load sensing resistor but also simulates the recirculation current through a recirculation current path provided for the motor or solenoid. The other input of comparator 12 receives the current reference from a digital/analog converter (DAC) 15, which may receive it serially from a microcomputer 18 by means of a data input circuit 16 and latch 17. Apparatus suitable for use as elements 12-18 to provide a COMPOUT signal for this apparatus is shown in co-pending U.S. patent application Ser. No. 07/340,813, entitled Method and Apparatus for Inductive Load Control with Current Simulation, filed Apr. 17, 1989 and assigned to the assignee of this application. In particular, that patent application provides a more detailed description of simulator circuit 14.

MOTHI and MOTLO signals are obtained from the armature terminals of the controlled motor or solenoid and applied to a multiple comparator circuit 20, along with a series of reference voltages derived from the vehicle ignition voltage $V_{ign}$ and the chip power supply voltage $V_{cc}$ in reference voltage generator circuit 21. The outputs of multiple comparator circuit 20 are provided to a fault logic circuit 22, the outputs of which are a FAULT signal and a fault code, the code being latchable by the FAULT signal into a fault register 23 for serial output to computer 18.

Microcomputer 18 provides control for the motor or solenoid through the MDI. Microcomputer 18 is the source of signals EN (enable), CS (chip select), F (forward operation), R (reverse operation), SCLK (system clock, 2 microseconds), and PWM. In addition, microcomputer 18 provides serial clock (SERCLK), data in (DI) and data out (DO) channels and receives the FAULT signal.

Motor or Solenoid Connections

Figure 4:
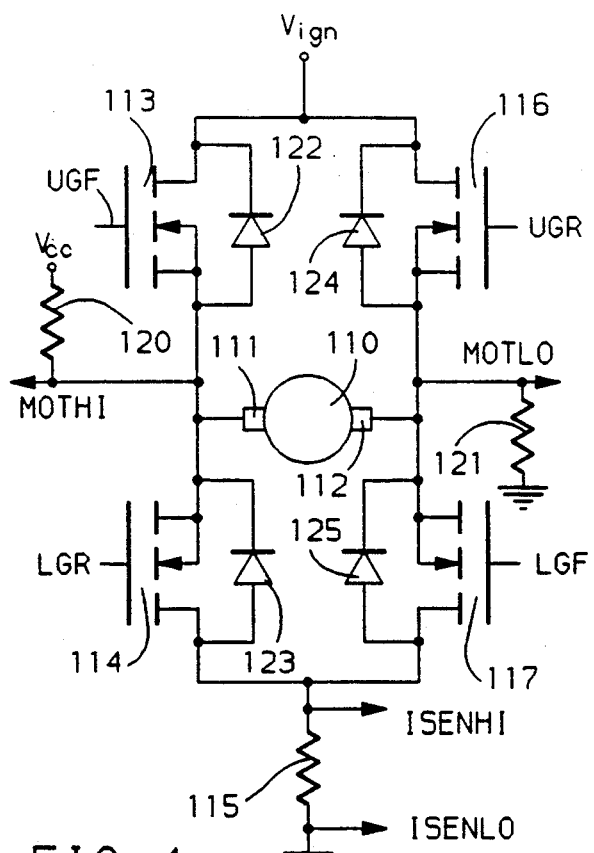
FIG. 4 is a circuit diagram showing the connections of the motor driver interface of FIG. 1 to a reversible DC motor in a FET H-bridge arrangement.

The connection arrangement for a rotating DC motor is shown in FIG. 4. A reversible DC permanent magnet motor 110 has a rotating armature with a standard commutator and brushes 111, 112 defining motor armature terminals, the voltages at which are sensed as signals MOTHI and MOTLO, respectively. Brush 111 is connected through a resistor 120 to $V_{cc}$; and brush 112 is connected through a resistor 121 to ground. Resistors 120 and 121 have resistance values much greater than the impedance of the motor armature so that neither will carry current sufficient, at the supply voltage indicated, to activate motor 110 (for example, 1.6K and 2.4K, respectively). The arrangement is used only for voltage sensing in the not enabled state, as will be described with reference to the FAULT determination circuit of FIG. 3. The operation of motor 110 is controlled through a power FET H-bridge circuit. Brush 111 is connected through a power FET 113 to $V_{ign}$ and through a power FET 114 and resistor 115 in series to ground. Likewise, brush 112 is connected through a power FET 116 to $V_{ign}$ and through a power FET 117 and resistor 115 to ground. Resistor 115 is a low resistance, high power (0.01 ohm, 2 W), current sensing resistor. The junction of the sources of power FETs 114 and 117 and the ungrounded end of resistor 115 provides a voltage signal ISENHI, while the grounded end of resistor 115 provides a voltage signal ISENLO. The output signals of the motor driver interface are provided to the gates of the FETs: UGF to FET 113, LGR to FET 114, UGR to FET 116 and LGF to FET 117. Each of FETs 113, 114, 116 and 117 is provided with a parallel, reverse oriented diode (122, 123, 124, 125, respectively) for recirculation current in the normal manner for such arrangements.

Figure 5:
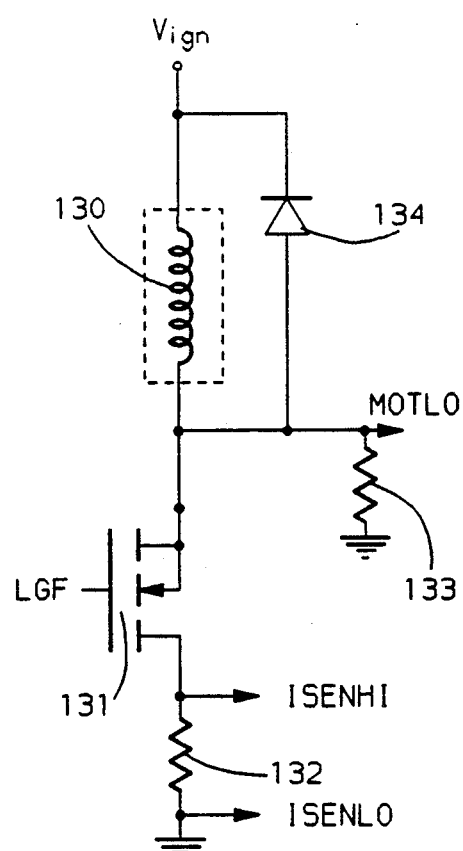
FIG. 5 is a circuit diagram showing the connections of the motor driver interface of FIG. 1 to a solenoid activating coil.

A solenoid driving arrangement is shown in FIG. 5. Solenoid 130 comprises a coil 130 with one end connected to $V_{ign}$ and the other connected through a power FET 131 and a current sensing resistor 132 to ground. The junction of solenoid 130 and the drain of FET 131 is connected through a resistor 133 to ground and provides a voltage signal MOTLO; while voltage signals ISENHI and ISENLO are provided from the ungrounded and grounded ends, respectively, of current sensing resistor 132. As with resistors 120 and 121, the resistance of resistor 133 is much greater than that of the controlled load, in this case solenoid 130, so that it does not provide a series activating current path for the load. The gate of FET 131 is provided with signal LGF from gate control 10 in this embodiment, although signal LGR could have been chosen. A current recirculating diode 134 is provided in parallel with solenoid coil 130.

Basic Operation and Mode Selection

Referring to FIG. 2, the voltage at the emitter of transistor 31, which is one input to AND gate 34, follows the PWM input. And gate 34 thus combines signals PWM and COMPOUT and provides its output, along with that of MIN ON timer 38, through OR gate 37 as a GATE signal to AND gates 35 and 36, only one of which may be enabled at a time, due to signals GF and GR. Thus, motor control is achieved in response to an enable signal EN, a forward/reverse direction signal (F or R), a mode select signal PWM, a current reference signal from a computer, and a current feedback signal (ISENHI-ISENLO) from the motor.

Assuming the MDI is connected as shown in FIG. 4 to control a motor 110, the chip is enabled (EN low) and forward motor operation is selected, upper power FET 113 is continuously activated by signal UGF and lower power FET 117 is turned on and off by signal LGF in response to the GATE signal output of OR gate 37 through AND gate 35, which is enabled by signal GF, and AND gate 27, which is enabled by EN low. Upper power FET 113, in addition to providing part of the motor current path when lower power FET 117 is turned on, also provides with diode 124 a recirculating current path for the inductive motor armature coil when lower power FET 117 is turned off. FETs 116 and 114 are turned off at this time by the low GR signal providing low LGR and UGR signals.

A bang/bang mode of operation may be selected by providing a constant $V_{cc}$ (5 volts) at the PWM input. Thus, the input to AND gate 34 from transistor 31 is continuously high; and the output of AND gate 34 is controlled in response to COMPOUT, the output of comparator 12, as modified by MIN ON timer 38. Comparator 12 compares a simulated motor current level, derived from the motor current sensing resistor 115 by means of voltage signals ISENLO and ISENHI, difference amplifier 13 and load current simulator 14, with a predetermined reference provided from computer 18 through data apparatus 16, latch 17 and DAC 15. The operation of suitable apparatus is described in more detail in the aforementioned patent application Ser. No. 07/340,813. Briefly, however, when FET 117 is turned on, the apparatus compares a voltage simulating the increasing motor load current with a predetermined reference and provides a high COMPOUT signal to AND gate 34 to continue conduction of FET 117 until the simulated motor load current exceeds the reference by an amount sufficient to switch the comparator output COMPOUT low (and the minimum ON time is exceeded). While the motor load current increases, a capacitor in simulator 14 is also charged at a rate simulating the build-up of magnetic energy in the motor armature windings. When COMPOUT goes low, FET 117 is disabled. The capacitor in simulator 14 is discharged to simulate the decreasing recirculation current, which is not measured by current sensing resistor 115 and must thus be simulated. When this simulated current falls below the reference by an amount sufficient to switch the comparator output COMPOUT high, FET 117 is again enabled and the cycle repeated. In bang/bang mode, the motor load current will thus be controlled to an average value determined by the operator controllable predetermined current reference supplied from computer 18.

If reverse motor operation is selected, the GR signal activates upper power FET 116 continuously, while lower power FET 114 is controlled by AND gate 34 through AND gate 36 and FETs 113 and 117 are turned off by the low GF signal. Apparatus such as that described in aforementioned patent aplication Ser. No. 4,924,158 is provided to ensure that forward and reverse signals cannot be provided simultaneously; and such apparatus protects the power FETs connected to the same motor brush from being simultaneously turned on with a resulting direct short circuit of the power supply.

In either the forward or the reverse direction, the MDI can also be operated in a PWM mode. For PWM mode, the predetermined reference supplied through DAC 15 is set to a high value so that COMPOUT stays continuously high; and a rectangular PWM signal alternating between $V_{cc}$ (5 volts) and ground is provided at the PWM input. In this mode, control of AND gate 34 is give to the PWM signal, which determines the average motor load current through its duty cycle. The PWM mode can be modified, if desired, by providing a predetermined current reference through DAC 15 which is high but not the highest possible value so as to normally provide PWM operation but still limit abnormally high motor load currents by shortening only those "on" pulses of the PWM signal which are sufficiently long to allow the simulated motor load current to exceed the reference. Of course, the MIN ON timer is also activated by the PWM signal.

A solenoid control mode is similar to the bang/bang mode except that $V_{ign}$ (9-16 volts) is provided to the PWM input. A single FET 131, as seen in FIG. 5, is connected to receive output signal LGF (alternatively, signal LGR could be chosen), so that forward operation is selected with signal F. The upper FET is not needed, since solenoid coil 130 need be activated in only one direction and its recirculating current diode 134 may be placed in parallel with the coil. The switching of FET 131 is similar to that exercised in the bang/bang mode, with average solenoid current being self regulating about a predetermined reference provided through DAC 15. The major difference between this mode and bang/bang mode is in the external solenoid connections and in the fault detection, which is yet to be described.

Fault Detection

Now that the structure and operation of the MDI has been described, the fault detection apparatus can be understood. The fault detection circuit is shown in detail in FIG. 3. The circuit provides detection of open or shorted loads, shorts to ground and shorts to $V_{ign}$ during static (not enabled, EN high) or dynamic (enabled, EN low) operation. The basic inputs to the fault detection circuit are the MOTHI and MOTLO signals from the two motor brushes, the enable signal EN (which distinguishes enabled and not enabled modes), and the PWM signal (which distinguishes solenoid and motor control modes). The circuit also uses, in the enabled state, the F,R and GATE signals.

Figure 3:
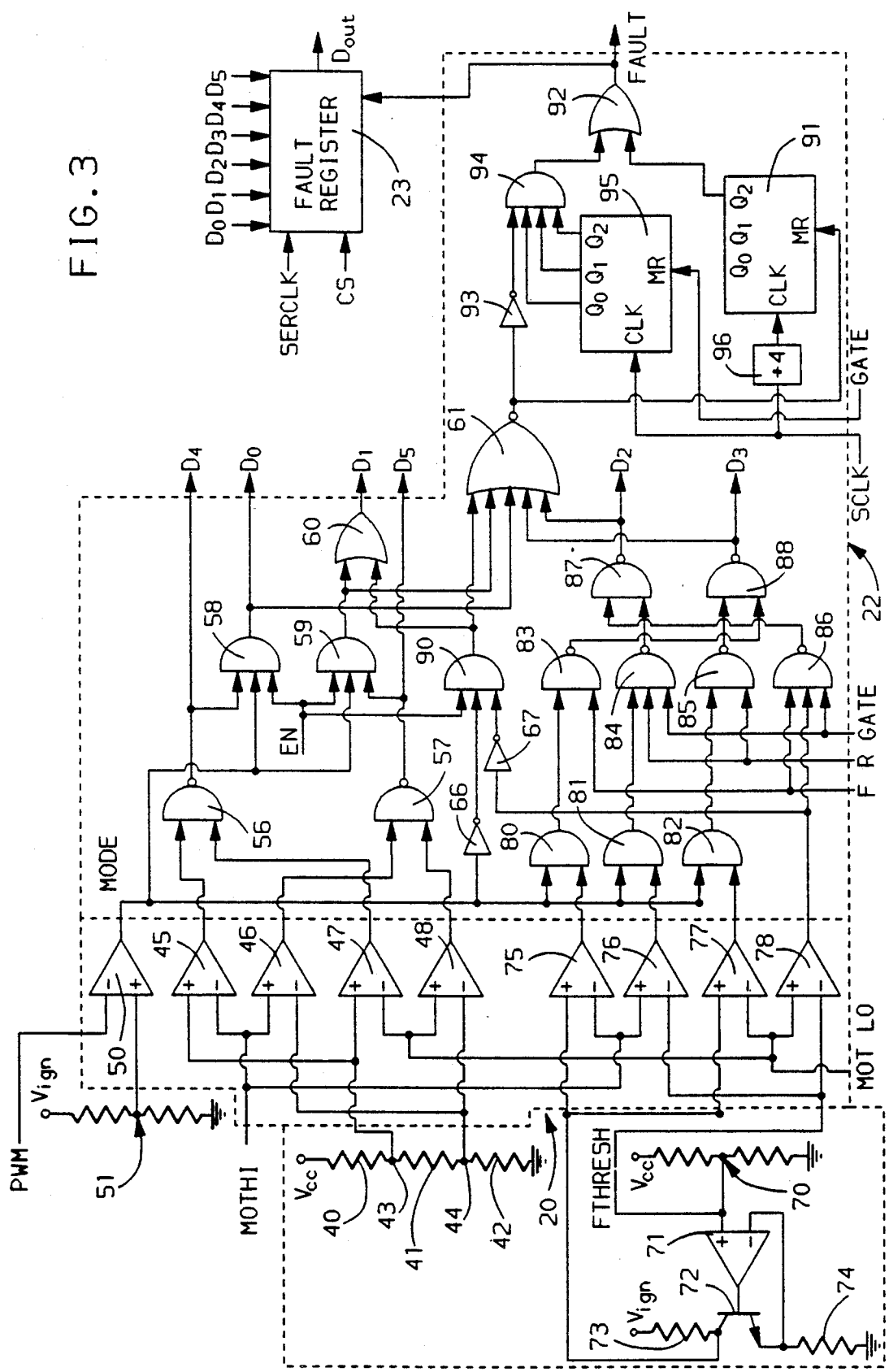
FIG. 3 is a circuit and logic diagram of reference voltage generators, comparators and fault logic for use in the motor driver interface of FIG. 1.

When the MDI circuit or chip is not enabled (EN high), the motor armature provides a low impedance path (about 0.50 ohms) through the armature windings between the brushes; and the FETs are off to present high impedance paths to Vign and ground. Thus, with reference to FIG. 4, MOTHI and MOTLO should both be at essentially the same voltage determined by the voltage divider of resistors 120 (1.6K) and 121 (2.4K) across $V_{cc}$. Referring to FIG. 3, resistors 40, 41 and 42 (50K each), connected in series across the same voltage $V_{cc}$, define a voltage window between junction 43 of resistors 40 and 41 and junction 44 of resistors 41 and 42. Both MOTHI and MOTLO should be within this voltage window (that is, between the voltages at junctions 43 and 44) then all FETs are off. Junction 43 is thus connected to the non-inverting inputs of comparators 45 and 47; and junction 44 is connected to the inverting inputs of comparators 46 and 48. MOTHI is provided to the inverting input of comparator 45 and the non-inverting input of comparator 46; while MOTLO is provided to the inverting input of comparator 47 and the non-inverting input of comparator 48.

The PWM input is provided to the inverting input of a comparator 50 having a non-inverting input provided with a reference voltage from a voltage divider 51 across $V_{ign}$. This voltage divider 51 provides a voltage just less than $V_{ign}$, so that the MODE signal output of comparator 50 is high in the PWM and bang/bang modes of operation, when the PWM voltage is never higher than $V_{cc}$ (5 volts). On the other hand, in the solenoid drive mode of operation, when $V_{ign}$ (9-16 volts) is provided to the PWM input, the MODE signal is forced low.

The outputs of comparators 45 and 47 are connected to the inputs of a NAND gate 56 providing an output $D_4$; while the outputs of comparators 46 and 48 are connected to the inputs of a NAND gate 57, which provides an output $D_5$. The outputs of NAND gates 56 and 57 are connected to inputs of AND gates 58 and 59, respectively; and each of AND gates 58 and 59 has an input provided with the enable signal EN and another input provided with the MODE signal from the output of comparator 50. The output of AND gate 58 provides a signal $D_0$; while the output of AND gate 59 is connected to one input of an OR gate 60 having another input, with connection to be described, and an output providing a signal $D_1$.

In operation, comparators 45-48 will provide outputs indicating whether MOTHI and MOTLO are within the defined voltage window. If they are (no faults), each of comparators 45-48 will have a high output; and $D_5$, $D_4$, $D_1$ and $D_0$ will all be low (0). A short of either side of motor 110 to $V_{ign}$ or ground or an open load will cause one or more of the comparators 45-48 to change its output state to a low output. A comparator output indicating a fault will be passed by AND gates 58 and 59 only when one of the motor control modes (PWM or bang/bang, not solenoid mode) is selected (MODE high) and the MDI circuit is not enabled (EN high). The detected fault will be indicated in the output signals $D_1$, $D_0$ forming a static (not enabled) fault status code which comprises the least significant bits of a fault status byte and are both low when no errors are present, due to the high outputs of comparators 45–48. If MOTHI shorts to $V_{ign}$, comparator 45 will switch low. If MOTLO shorts to $V_{ign}$, comparator 47 will switch low. Either of these changes will switch $D_0$ high; and 0, 1 is thus the static fault status code in $D_1$, $D_0$ for short to $V_{ign}$. Likewise, a short of either MOTHI or MOTLO to ground causes a static fault status code of 1,0; and an open load causes a static fault status code of 1, 1. Bits $D_5$ and $D_4$ of the fault status byte, which are not affected by the EN and MODE signals are of use when the EN signal is low (enabled) but the chip output has been turned off due to the detection of a dynamic (enabled) error.

In the enabled state, when the EN signal is low, at least one of the upper FETs 113 and 116 and sometimes one of the lower FETs 114 and 117 will be turned on; and MOTHI and MOTLO will have quite different desired voltage ranges from those expected in the not enabled state. Thus a different error detection arrangement is required. The EN signal thus disables AND gates 58 and 59 to guarantee a 0, 0 static error status code in $D_1$, $D_0$. Generally, one side of motor 110—MOTHI or MOTLO, depending on whether forward or reverse motor drive is selected—will be only a small voltage drop of a conducting FET lower than $V_{ign}$, while the other side will be a similar voltage drop up from ground if the lower FET is conducting or at a high voltage substantially the same as the one side of the motor if the lower FET is not conducting. Voltage windows are therefore defined with reference to some voltage FTHRESH above ground and the same voltage less than $V_{ign}$, where FTHRESH (for example, 3 volts) is greater than the source/drain voltage of a conducting power FET. In normal operation, a motor terminal can be expected to be within one of these windows.

A reference voltage generator comprises a voltage divider 70 across $V_{cc}$ generating the reference voltage FTHRESH, which is provided to the inverting inputs of comparators 76 and 78. FTHRESH is also provided to the non-inverting input of an op-amp 71 having an output connected back to its inverting input also to the base of an NPN transistor 72 having a collector connected through a resistor 73 to $V_{ign}$ and an emitter connected through a resistor 74 to ground. The collector of transistor 72, which is thus maintained at a voltage $V_{ign}$ minus FTHRESH, is provided to the non-inverting inputs of comparators 75 and 77. MOTHI is provided to the inverting input of comparator 75 and the non-inverting input of comparator 76; while MOTLO is provided to the inverting input of comparator 77 and the non-inverting input of comparator 78.

The outputs of comparators 75, 76 and 77 are provided to inputs of AND gates 80, 81 and 82, respectively, each of which AND gates is further provided with the MODE signal on its other input. The output of comparator 78 is not gated by the MODE signal and is thus the only comparator to be effective in error determination in solenoid drive mode. Since the allowed values of MOTHI and MOTLO are different for forward and reverse motor drive, this information must enter the logic. The output of AND gate 80 is provided to an input of a NAND gate 83, which has an additional input of the forward drive signal F. The output of AND gate 81 is provided to an input of a NAND gate 84, which has additional inputs of the reverse signal R and the GATE signal (from FIG. 2). The output of AND gate 82 is provided to an input of a NAND gate 85, which has an additional input of the reverse drive signal R. The output of comparator 78 is connected to an input of a NAND gate 86, which has additional inputs of the forward drive signal F and GATE. A NAND gate 87 has inputs connected to the outputs of NAND gates 84 and 86 and an output providing a signal $D_2$. A NAND gate 88 has inputs connected to the outputs of NAND gates 83 and 85 and an output providing a signal $D_3$. Signals $D_3$ and $D_2$ provide a two bit dynamic fault status code and form the third and fourth least significant bits of the fault status byte.

With no faults, comparator 75 will have a low output for forward operation, since upper FET 113 will be turned on. This will produce a low output from AND gate 80 and a high output from NAND gate 83. In forward operation, the low signal R will guarantee a high output from NAND gates 84 and 85. If the lower FET 117 is gated on, the output of comparator 78 will be low; but if it is gated off, the GATE signal will be low. In either case, the output of NAND gate 86 will be high. Thus, the outputs of NAND gates 83–86 will all be high; and signals $D_3$ and $D_2$ will both be low (0, 0). Similar analysis shows the same no fault output for reverse operation, with upper FET 116 turned on and lower FET 114 gated on or off.

In forward enabled operation, the circuit is able to detect a short of MOTHI to ground, regardless of the conducting state of lower FET 117, as comparator 75 switches high to switch NAND gate 83 low and generate a $D_3$, $D_2$ output of 1, 0. Detection of a short of MOTLO to $V_{ign}$, however, can only be detected when FET 117 is turned on. In this case, comparator 78 switches high; and NAND gate 86, receiving additional high inputs from GATE and EN, switches low to cause a $D_3$, $D_2$ output of 0, 1. Reverse enabled operation is similar but uses comparator 77 and NAND gate 85 to detect a short of MOTLO to $V_{ign}$ for a $D_3$, $D_2$ output of 0, 1 and uses comparator 76 and NAND gate 84 to detect a short of MOTHI to ground and produce a $D_3$, $D_2$ output of 1, 0. If the load is shorted, the outputs of comparators 75–78 are all high with the appropriate lower FET turned on. For forward or reverse operation, this will produce a $D_3$, $D_2$ output of 1, 1 with a high GATE signal.

For solenoid drive, only comparator 78 matters (assuming the solenoid is connected between MOTLO and ground as in FIG. 5); and the outputs of comparators 75–77 are thus gated low in responsive to a low MODE signal as previously described. In the enabled state (EN low), $D_3$ is held at "0" while bit $D_2$ goes to "1" with a short of MOTLO to $V_{ign}$. In the not enabled state (EN high), there will be no high GATE signal; so the $D_2$ signal remains low. However, additional circuitry is provided to detect a short to ground in the not enabled state. The MODE signal from comparator 50 is inverted by an inverter 66 and provided to one input of an AND gate 90. Signal EN is provided to another input of AND gate 90. Finally, the third and last input of AND gate 90 receives the output of comparator 78 inverted by an inverter 67. AND gate 90 has an output connected to an input of OR gate 60 and thus provides a high output for $D_1$ when solenoid mode is selected, the MDI circuit is not enabled, and comparator 78 detects a short to ground.

The circuit further creates a digital FAULT signal which goes high when a fault is present and low when no fault is present. The outputs of AND gates 58 and 59, NAND gates 87 and 88, and AND gate 90 are provided to the inputs of NOR gate 61, which will thus go low if a "1" bit appears in any of $D_3$, $D_2$, $D_1$, and $D_0$. The output of NOR gate 61 is provided to the reset MR input of a timer 91; and the SCLK signal (a pulse every 2 microseconds) is provided through a divide-by-four circuit to the CLK input of timer 91, which is thereby clocked every 8 microseconds. The $Q_2$ output of timer 91 is connected to the input of an OR gate 92, the output of which is the FAULT signal. Timer 91 is released to start counting clock pulses when the output of NOR gate 61 goes low; and, if NOR gate 61 has remained continuously low until the $Q_2$ output of timer 91 goes high (after 24 microseconds), FAULT is sent high to latch bits $D_7$-$D_0$ into fault register 23 ($D_7$ may be the FAULT signal itself and $D_6$ may be any other fault signal bit). The fault condition must be continuous for the 24 microseconds, since its discontinuation will provide a high signal to the MR input for a stop and reset of timer 91. The requirement of a continuous fault signal for 24 microseconds before latching provides noise filtering in both the enabled and not enabled states to reduce the chance of false fault detection. The FETs are chosen for their ability to withstand short circuit currents for a least 50 microseconds, which allows time for this filtering.

However, the output of NOR gate 61 is further provided through an inverter 93 to one input of an AND gate 94. AND gate 94 has other inputs from the $Q_2$, $Q_1$ and $Q_0$ outputs of another timer 95, which receives SCLK clock pulses every 2 microseconds on a CLK input and signal GATE on an MR reset input. The output of AND gate 94 is provided to the other input of OR gate 92. If NOR gate 61 goes low, timer 95 will generate a FAULT signal on the seventh count (14 microseconds) after a lower FET is turned on (GATE goes high) if a fault condition exists at the time, since all inputs to AND gate 94 are high. This FAULT signal will be similarly passed through NOR gate 92 to cause fault register 23 to read and store the signals on lines $D_7$-$D_0$, from which they are serially read onto the control computer. In this manner, no FAULT signal will be generated during the first 14 microseconds after a lower FET is turned on, during which time FET switching delays could otherwise cause a false fault signal to be generated. The delay of timer 95, however, is much shorter than that of timer 91, since it is only meant to get past the initial lower FET turn-on, which initially looks like a short to $V_{ign}$. However, it is desirable to test for a shorted load as soon as this initial period is passed, since the inductance for a shorted motor condition is minimal and the current thus builds up b rapidly. The MIN ON timer ensures that the FET will not be turned off by the COMPOUT signal before the end of 16 microseconds so that the fault detection apparatus may test for a shorted load after the initial FET turn-on period. In addition,, a fault condition need not be present continuously for the 14 microseconds. On the contrary, since the test is for a fault condition at a particular time (14 microseconds after FET turn-on), the timer is connected with a continuous GATE signal at input MR so that the fault indication from NOR gate 61 need only be present at that time for a FAULT to be latched.

The embodiments of the invention in which an exclusive property or privilege is claimed are defined as follows:

1. In an H-bridge electric motor drive apparatus comprising an electric power supply having supply and ground voltage terminals, a first pair of switching transistors connected in series with the power supply, a second pair of switching transistors connected in parallel with the first pair of switching transistors, and an electric motor having a first motor terminal connected to the junction of the first pair of switching transistors and a second terminal connected to the junction of the second pair of switching transistors, the switching transistors being activatable to a conducting condition in a predetermined combination in response to a first input control signal to connect the electric motor across the electric power supply for motor activation and further activatable to a non-conducting condition in response to a second input control signal to disconnect the electric motor from the electric power for motor deactivation, fault detection apparatus comprising, in combination:

means effective to compare the voltage at one of the first and second motor terminals with at least one reference voltage to determine a fault condition;

a first timer response to a continuous detection of the fault condition to define a first time period from the initiation of said continuous detection;

a second timer responsive to a continuous presence of the first input control signal to define a second time period from the initiation of said first output control signal;

means effective to store a fault signal in response to the detection of the fault condition at the end of the first or second time periods.

2. The fault detection apparatus of claim 1 in which the fault condition is a voltage at the one of the first and second motor terminals indicating a short circuit to the power supply, the second time period is just longer than the time required to establish stable switching transistor conduction, and the first time period is longer than the second time period but shorter than that required for switching transistor damage due to a short circuit across the power supply.

3. The fault detection apparatus of claim 2 in which the first time period is 24 microseconds and the second time period is 14 microseconds.

4. The fault detection apparatus of claim 1 in which the first timer is responsive to detection of the fault condition at a reset input to count clock pulses received at a clock input and the second timer is responsive to the first input control signal at a reset input to count clock pulses received at a clock input.

5. The fault detection apparatus of claim 4 in which the first timer is effective to reset its count in the absence of the detected fault condition at its reset input and the second timer is effective reset its count in the absence of the first input control signal at its reset input.

6. The fault detection apparatus of claim 5 in which the first timer has output means effective to signal the end of the first time period when the first timer counts a first predetermined number of clock pulses received at its clock input and the second timer has output means effective to signal the end of the second time period when the second timer counts a second predetermined number of clock pulses received at its clock input.

7. The fault detection apparatus of claim 6 further comprising gate means for generating the fault signal in response to the output means of the first timer indicating the end of the first time period or in response to the simultaneous detection of the fault condition and the output means of the second timer indicating the end of the second time period.

* * * * *